United States Patent [19]

Gault

[11] Patent Number: 4,577,210
[45] Date of Patent: Mar. 18, 1986

[54] CONTROLLED RECTIFIER HAVING RING GATE WITH INTERNAL PROTRUSION FOR DV/DT CONTROL

[75] Inventor: John M. Gault, Manhattan Beach, Calif.

[73] Assignee: International Rectifier Corporation, Los Angeles, Calif.

[21] Appl. No.: 407,435

[22] Filed: Aug. 12, 1982

[51] Int. Cl.[4] .................. H01L 23/48; H01L 27/24; H01L 29/10

[52] U.S. Cl. ........................................ 357/38; 357/86; 357/20; 357/68

[58] Field of Search ............... 357/86, 38, 20, 68

[56] References Cited

U.S. PATENT DOCUMENTS

| | | | |
|---|---|---|---|
| 3,579,060 | 5/1971 | Davis | 357/38 |
| 3,586,927 | 6/1971 | Roach | 357/86 |
| 3,914,783 | 10/1975 | Terasawa | 357/38 |
| 3,943,548 | 3/1976 | Terasawa | 357/38 |
| 4,016,591 | 4/1977 | Terasawa | 357/38 |
| 4,028,721 | 6/1977 | Yatsuo et al. | 357/38 |
| 4,063,270 | 12/1977 | Kimura et al. | 357/38 |
| 4,086,612 | 4/1978 | Voss | 357/38 |
| 4,114,178 | 9/1978 | Terasawa et al. | 357/38 |
| 4,261,001 | 4/1981 | Temple | 357/86 |
| 4,352,118 | 9/1982 | Temple | 357/20 |

FOREIGN PATENT DOCUMENTS 0013768  2/1981  Japan ................ 357/38 C

Primary Examiner—Andrew J. James
Assistant Examiner—S. V. Clark
Attorney, Agent, or Firm—Ostrolenk, Faber, Gerb & Soffen

[57] ABSTRACT

A controlled rectifier employing a ring gate and an auxiliary emitter is disclosed. Auxiliary gates of different sensitivity cooperate with the auxiliary emitter. The controlled rectifier has gallium-diffused junctions and a phosphorus-diffused emitter. Phosphorus gettering dots or rings are diffused into the gallium-diffused region at the upper surface of the device surrounding and beneath portions of the ring gate electrode. The ring gate electrode has a narrow finger which extends from its internal periphery and overlaps a narrow extension from the main central emitter in order to provide a non-injecting current path for the peripheral distributed capacitance current which flows during the application of forward voltage. The value of this current is proportional to the rate of application of voltage or dV/dt.

6 Claims, 7 Drawing Figures

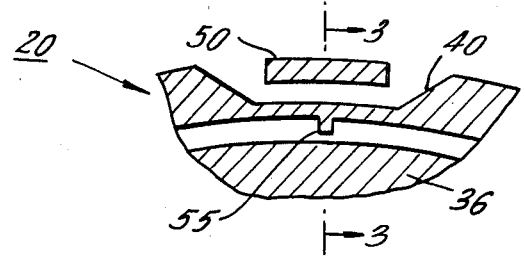
FIG. 1a.
FIG. 1.
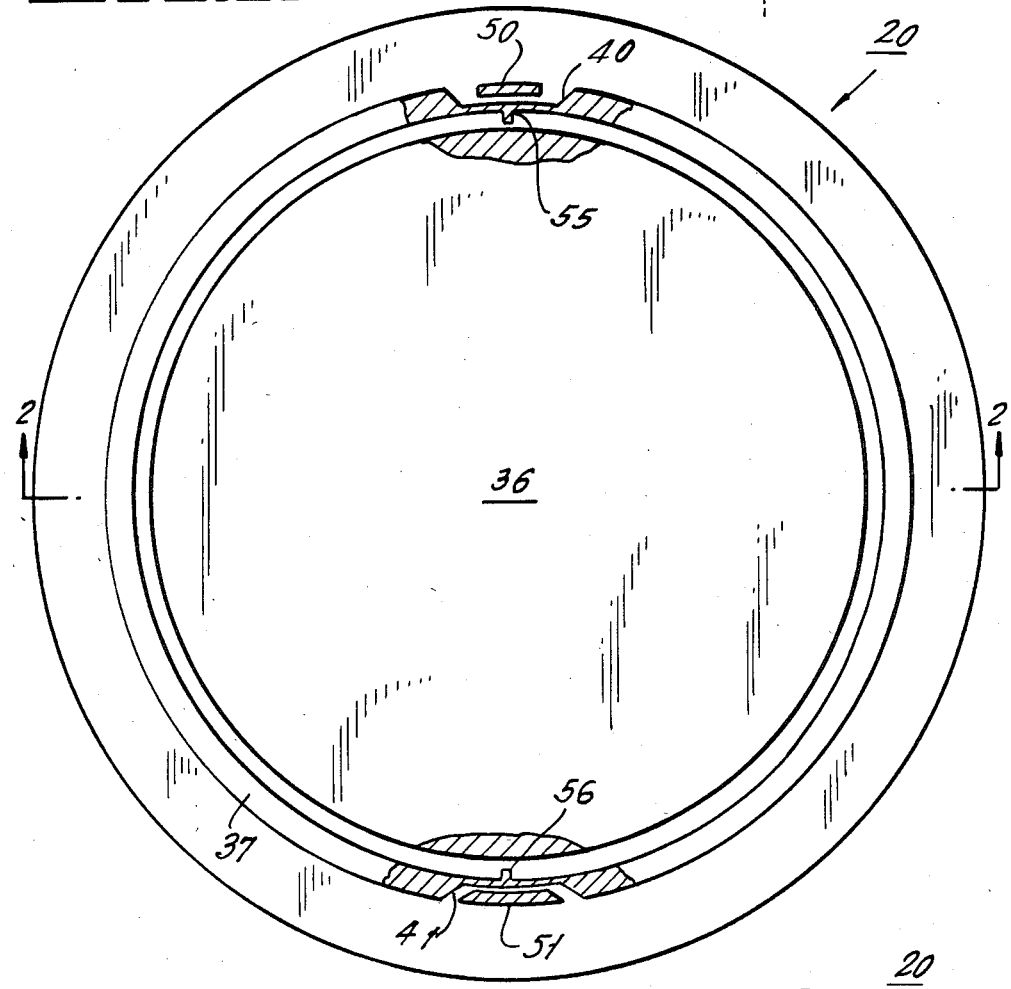
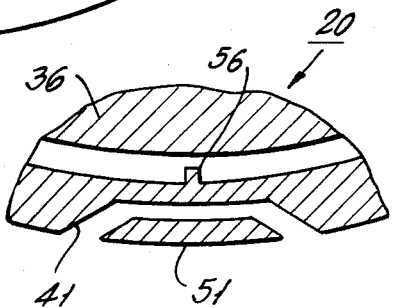
FIG. 1b.

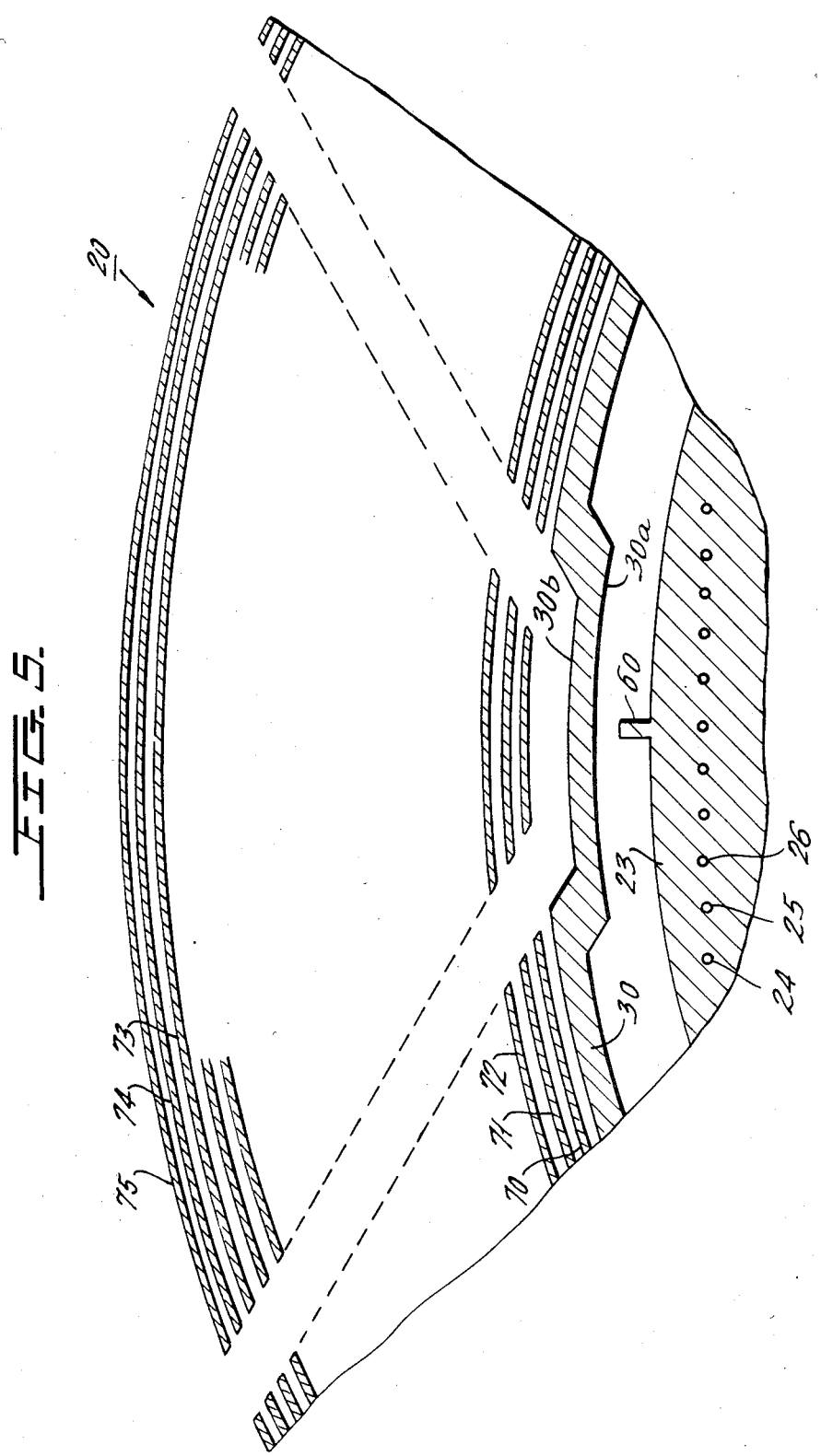

CONTROLLED RECTIFIER HAVING RING GATE WITH INTERNAL PROTRUSION FOR DV/DT CONTROL

RELATED APPLICATIONS

This application is related to co-pending application Ser. No. 407425, filed Aug. 12, 1982, in the name of Anders Nilarp, entitled "SCR Having Multiple Gates and Phosphorous Gettering Exteriorly of a Ring Gate" (IR-751).

BACKGROUND OF THE INVENTION

This invention relates to controlled rectifiers and more particularly relates to a novel controlled rectifier having a ring gate which is less subject to dV/dt turn-on.

Controlled rectifiers employing an auxiliary cathode to permit the firing of the device from a very low input gate current are well known. Such devices are shown, for example, in U.S. Pat. No. 3,586,927 in the names of Thomas J. Roach and James H. Hauck and assigned to the assignee of the present invention. Devices employing auxiliary cathodes and main ring gates are also known wherein the main ring gate surrounds and is spaced from a main cathode disc which is in contact with a central diffused emitter region on the upper surface of a semiconductor wafer. The ring gate is disposed atop an auxiliary emitter region and acts as an auxiliary cathode with respect to a small input gate element. The ring gate then acts as the main gate for the main device and causes injection of electrons from the main emitter which in turn fires the device and causes conduction between the main cathode and the anode.

Ring gates are desirable since they increase the rate-of-change-of-current (dI/dt) capability of the device during firing, since the entire emitter area turns on more quickly than in devices in which the main gate is a point gate. However, devices using a ring gate geometry have a high distributed capacitance beyond the main emitter region. Consequently, a voltage having a high dV/dt applied between the cathode and anode can cause sufficient injection of electrons from the emitter through the distributed capacitance to cause dV/dt turn-on of the device.

The principal object of this invention is to retain the desirable dI/dt features of the ring gate structure for a controlled rectifier, but to reduce the sensitivity of the device to firing due to high dV/dt.

BRIEF DESCRIPTION OF THE INVENTION

In accordance with the present invention, a small peripheral region or point on the ring gate is electrically connected to the main emitter region. Preferably, a small metallic protrusion is provided on the interior of the ring gate and this protrusion overlies and contacts a narrow extension from the main emitter region. Consequently, the capacitive current is shunted through a non-injecting path between the radially spaced ring gate and central emitter. The connection between gate and emitter is a relatively high resistance connection and will not interfere with the electrical isolation of the gate and emitter at regions circumferentially removed from the electrical connection area.

Other geometries could be employed to make a small region of contact between the main emitter and the ring gate to accomplish the reduction of the capacitance between the main emitter and the gate. If desired, the protrusion or extension from the main ring gate can occur at several circumferentially spaced points along the ring gate with corresponding emitter projections underlying and contacting the ring gate extensions.

By employing the novel protrusion, it has been found that dV/dt turn-on of devices has been improved from 150 volts per microsecond to over 4,000 volts per microsecond for a device having a diameter of 0.900".

BRIEF DESCRIPTION OF THE DRAWINGS

FIG. 1 is a top view of a controlled rectifier employing the novel features of the present invention.

FIG. 1a is an enlarged view of a first gate region of FIG. 1.

FIG. 1b is an enlarged view of a second gate region in FIG. 1.

FIG. 3 is an enlarged cross-sectional view, partly in isometric form, of FIG. 1a taken across the section line 3—3 in FIG. 1a.

FIG. 5 is a top view of the gate region of FIG. 1a but shows only the phosphorus diffusion which forms the main and auxiliary emitters and gettering rings which are exterior of the ring gate.

DETAILED DESCRIPTION OF THE DRAWINGS

Figure 2:
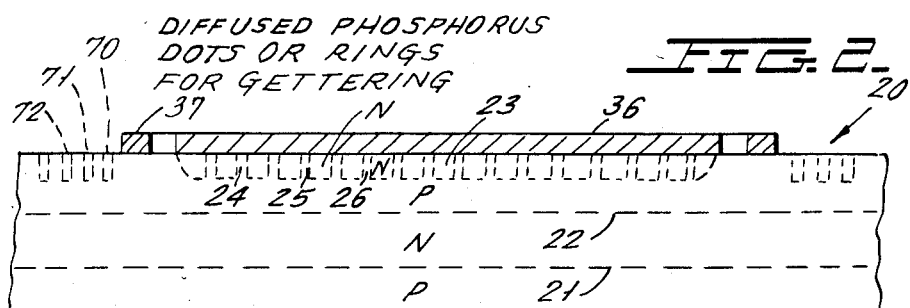
FIG. 2 is a cross-sectional view of FIG. 1 taken across the section line 2—2 in FIG. 1 and shows the use of shorting dots extending through the emitter layer and phosphorus diffused regions in the wafer surface external of the ring gate electrode.
Figure 3:
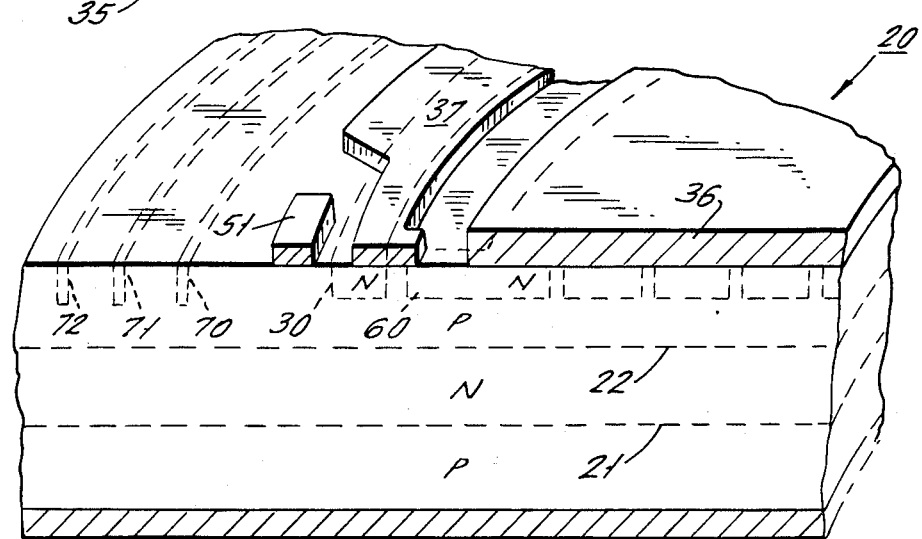

Referring to the drawings, there is shown a controlled rectifier which consists of a disc or wafer of monocrystalline silicon 20 which can, for example, have a thickness of 15 mils and a diameter of 900 mils. Obviously, other dimensions can be employed. The wafers can be formed of an initially N-type material and junctions 21 and 22 are formed into the wafer as shown in FIGS. 2 and 3 as by a gallium diffusion or by any other diffusion process desired. A main emitter region 23 is then formed within the underlying P-type layer using, for example, a phosphorus diffusion.

During the diffusion of the main emitter region 23, a suitable mask can be employed to leave P-type regions or dots such as regions 24, 25 and 26 which extend through the emitter to the upper surface of the wafer 20 in order to short the emitter to the P-type region above junction 22 and thus improve the dV/dt characterisitcs of the device in the known manner. During the phosphorus diffusion of emitter 23, a ring-shaped auxiliary emitter region 30 is also diffused.

Note that the sequence of junctions described above can be reversed so that there is a P-type emitter, if desired.

A conventional contact 35 is then connected to the bottom or anode region of the device and serves as the anode electrode of the device. The upper main cathode contact consists of the cathode contact 36 which can be formed of any desired conductive disc and adhered to the silicon wafer in any desired manner. A ring gate 37 is also affixed to the surface of the wafer 20 as by soldering or the like, and is spaced from the outer periphery of the cathode disc 36 as is desired. Any desired metallizing system can be used to form the anode, cathode and gate contacts.

Figure 4:
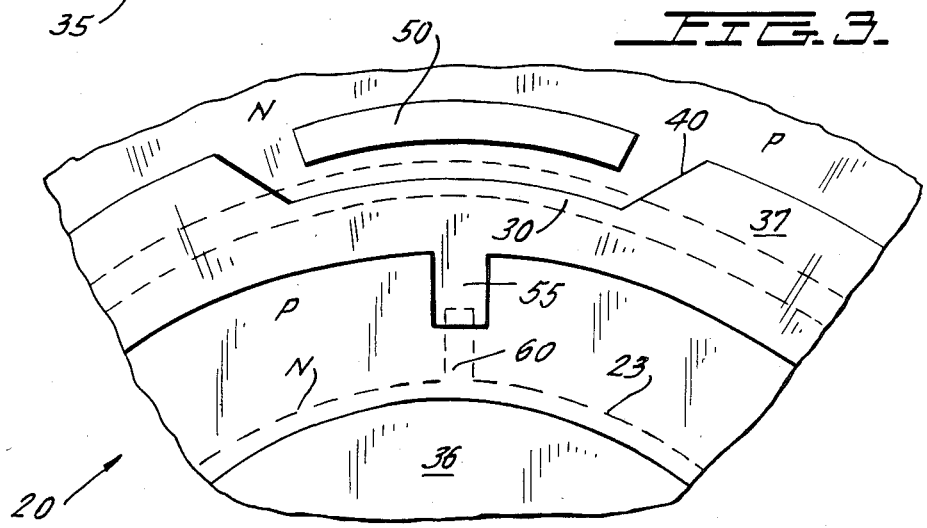
FIG. 4 is a top view of FIG. 3 and illustrates the relationship between the gate metals and the main and auxiliary emitter regions.

As is best shown in FIG. 1, the cathode ring has two exterior notches 40 and 41 (see FIGS. 1a and 1b, respectively), wherein the exterior periphery of notches 40 and 41 straddle the radial thickness of the auxiliary emitter 30 as shown in FIGS. 4 and 5. Auxiliary gate contacts 50 and 51 are disposed within the exterior outline of the notches 40 and 41, respectively, and are spaced from the outer periphery of the auxiliary emitter 30 as best shown in FIGS. 3 and 4.

The interior periphery of ring gate 37 then has an inwardly projecting metallic section 55 which is disposed at the center of a line bisecting gate segment 50. A second projection 56 from ring gate 37, shown in FIG. 1, is associated with and bisects the length of auxiliary gate 51. The diffusion pattern of the main emitter 23 then has extending sections which extend under and electrically contact metallic projections 55 and 56 of the gate ring. Thus, as shown in FIGS. 3 and 4, extending section 60 of the main emitter 23 underlies and is in contact with projection 55 from the ring gate 37.

The use of one or more projections, such as projections 55 and 56 which overlap extensions 60 from the main emitter, provide a non-injecting shunt path for the capacitance current between the ring gate 37 and the emitter region 23. As a result of this novel geometry, the device is made substantially less subject to dV/dt turn-on which has previously been caused in ring gate structures.

In particular, with all other structural elements equal, the use of a point connection between the ring gate 37 and emitter region 23 has increased dV/dt turn-on from 150 volts/microsec. to over 4,000 volts/microsec. in a device having a diameter of 0.900 inches.

FIGS. 2, 3 and 5 illustrate a phorphorus diffusion pattern which is applied to the silicon wafer P-type region above junction 22 and exterior of the ring gate. These phorphorus regions serve as a getter for unwanted impurities or defects. Thus, during the diffusion of the emitter pattern, concentric phosphorus rings such as rings 70–75 are diffused completely out to the edge of the device beginning from the auxiliary emitter region 30. If desired, the individual rings 70–75 could be replaced by a dot pattern opposite to the dots 24–26 in the main emitter. Note that the region of auxiliary emitter 30 which is circumferentially removed from gate contacts 50 and 51 has no electrical function, but simply acts as a further phosphorus getter region. Note also that the phosphorus diffusion for making the main and auxiliary emitters (with emitter shorting dots), and the gettering rings 70–75 are formed in a single process step, using a single mask.

The use of the phosphorus rings or equivalent phosphorus dots increases the minority carrier lifetime of the material after gallium diffusion of junctions 21 and 22 from 5–6 microseconds to 40–50 microseconds. This produces an improvement in the blocking and room temperature characteristics of the device.

In the preferred embodiment of the invention, two gate regions are used as shown in FIGS. 1, 1a and 1b. These two gate regions are not identical but differ in their characteristics so that the gates have different sensitivity to turn-on.

Gate sensitivity is determined by the space and thus the resistance between the ends of the gate pads 50 and 51 and the confronting sides of notches 40 and 41, respectively, which contact the underlying P-type material. The distance between the edges of gate 51 from the sides of notch 41 can be made less than the corresponding distance between gate pad 50 and the sides of notch 40. Consequently, the use of gate pad 50 will make the device less sensitive and the use of gate 51 will make it more sensitive. Only one gate lead will be selected for use during assembly of the device, according to the desired specifications of the device.

The present invention was used in a device having the following dimensions: A silicon wafer having a diameter of 1.350" was employed. The radius of the emitter region 23 was 0.479". The radius of the cathode contact was 0.4775" and it was centered on the emitter region. (The outer diameter of the main inner periphery of the auxilary emitter region 30 was 0.509".) This distance was reduced to 0.500" along peripheral section 30a in FIG. 5. The extension 60 from the main emitter facing section 30a at each gate region was about 0.0015" in width and had a length of about 0.011". (The outer diameter of the auxiliary emitter region 30 was 0.520".) The phosphorus rings 70–75 all had a radial width of about 0.002" and a spacing of about 0.005". The peripheral section 30b in FIG. 5 of the auxiliary emitter cutout had a length of about 0.100". A different length of 0.094" was selected for the other gate region in order to change the sensitivity of that gate region.

The ring gate 37 had an inner diameter of 0.499" and an outer diameter of 0.534". The cutouts generally follow the shape of the peripheral deformations of the auxiliary emitter 30 shown by surfaces 30a and 30b in FIG. 5 such that the outer edge of the gate ring 37 is located at the center of the auxiliary emitter region 30. The projections 55 and 56 from the gate ring had a length of 0.010" and a width of about 0.006". The gates 50 and 51 had dimensions suitable to permit them to fit within the outer periphery of ring gate 37, but their inner peripheries are spaced from the outer peripheral surfaces 30b of the auxiliary emitter 30 by 0.010". The circumferential length of auxiliary gate 50 is about 0.080" with rectangular ends while the circumferential length of auxiliary gate 51 is also 0.80" for its short circumferential leg, but about 0.104" for its outer circumferential length to define the general trapezoidal shape of member 51. The outer periphery of the silicon wafer was tapered in the usual manner.

Obviously, other dimensions can be selected as desired to make devices having other electrical properties. Also, any suitable housing can be used to contain the completed device, as will be apparent to those skilled in the art.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A controlled rectifier having a ring gate and an increased resistance to dV/dt turn-on; said controlled rectifier comprising a wafer of monocrystalline semiconductor material having generally flat parallel first and second surfaces; said first surface containing a central emitter diffusion region having a generally flat cathode contact secured thereto; said emitter region being of one of the conductivity types; said emitter region being formed in and surrounded at said first surface by a second region which is of the other of the conductivity types; said emitter region having a short peripheral portion extending from its outer periphery; and a ring-shaped gate contact disposed on said first surface and surrounding and radially spaced from the exterior of said central emitter diffusion region and from the exterior of said flat cathode contact; said ring-shaped gate having an exterior periphery and an interior periphery; said ring-shaped gate contact having a short peripheral portion thereof extending from said interior periphery and electrically connected at said first surface to said short peripheral extending portion of the outer periphery of said central emitter diffusion region, thereby to provide a non-injecting current path for distributed capacitance current which flows from said ring gate during the application of forward biasing voltage to said controlled rectifier and further including an auxiliary emitter region in said first surface; said auxiliary emitter region at least partly underlying and connected to said ring gate and being spaced from said central emitter diffusion region; and an auxiliary gate connected to said first surface at a point spaced from said auxiliary emitter region.

2. The controlled rectifier of claim 1, wherein said emitter region is circular and wherein said gate ring is circular.

3. The controlled rectifier of claim 1 which includes an anode contact connected to said second surface.

4. The controlled rectifier of claim 1, wherein said short peripheral portion includes at least one narrow projecting finger extending from the internal edge of said ring gate and toward said central emitter region.

5. The controlled rectifier of claim 1, wherein said short peripheral portion includes at least one narrow projecting finger extending from the outer periphery of said central emitter region toward said ring gate.

6. The controlled rectifier of claim 4, wherein said short peripheral portion further includes at least one narrow projecting finger extending from the outer periphery of said central emitter region toward and underlying said finger extending from said ring gate.

* * * * *